(12) United States Patent
Sato et al.

(10) Patent No.: US 8,022,464 B2
(45) Date of Patent: Sep. 20, 2011

(54) SEMICONDUCTOR MEMORY DEVICE AND MANUFACTURING METHOD THEREOF

(75) Inventors: Atsuhiro Sato, Kanagawa-ken (JP); Fumitaka Arai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 12/506,566

(22) Filed: Jul. 21, 2009

(65) Prior Publication Data

US 2010/0019311 A1 Jan. 28, 2010

(30) Foreign Application Priority Data

Jul. 22, 2008 (JP) ................................ 2008-188916

(51) Int. Cl.
*H01L 29/788* (2006.01)
(52) U.S. Cl. ....................... 257/316; 438/257
(58) Field of Classification Search .................... 257/316
See application file for complete search history.

(56) References Cited

U.S. PATENT DOCUMENTS

| 6,800,423 | B2 * | 10/2004 | Yokoyama et al. | 430/311 |
|---|---|---|---|---|
| 2007/0257305 | A1 * | 11/2007 | Sasago et al. | 257/316 |
| 2008/0217674 | A1 * | 9/2008 | Watanabe | 257/316 |
| 2008/0283898 | A1 * | 11/2008 | Kuniya | 257/316 |

* cited by examiner

*Primary Examiner* — Thao X Le
*Assistant Examiner* — Kimberly Trice
(74) *Attorney, Agent, or Firm* — Oblon, Spivak, McClelland, Maier & Neustadt, L.L.P.

(57) ABSTRACT

This semiconductor memory device comprises a semiconductor substrate, a plurality of tunnel insulator films formed on the semiconductor substrate along a first direction and a second direction orthogonal to the first direction with certain spaces in each directions, a plurality of charge accumulation layers formed on the plurality of tunnel insulator films, respectively, a plurality of element isolation regions formed on the semiconductor substrate, the plurality of element isolation regions including a plurality of trenches formed along the first direction between the plurality of tunnel insulator films, a plurality of element isolation films filled in the plurality of trenches, a plurality of inter poly insulator films formed over the plurality of element isolation regions and on the upper surface and side surfaces of the plurality of charge accumulation layer along the second direction in a stripe shape, a plurality of air gaps formed between the plurality of element isolation films filled in the plurality of trenches and the plurality of inter poly insulator films and a plurality of control gate electrodes formed on the plurality of inter poly insulator films.

14 Claims, 23 Drawing Sheets

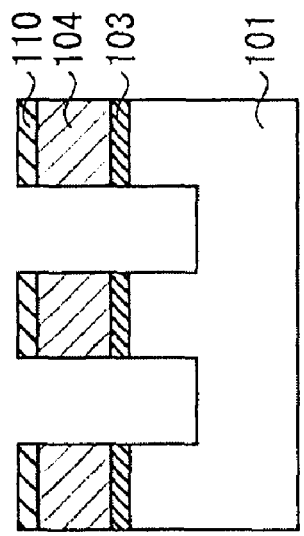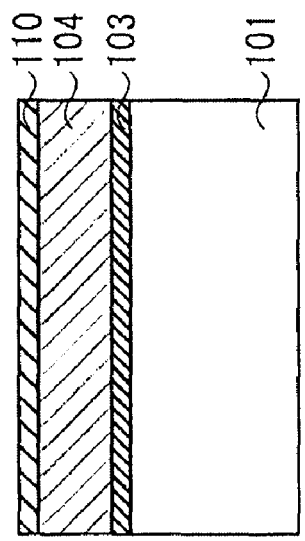

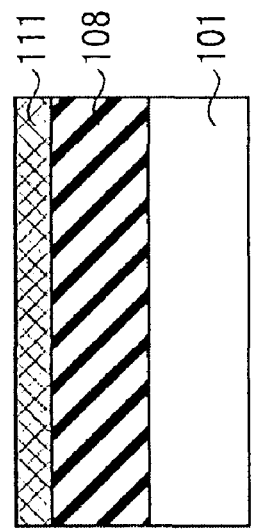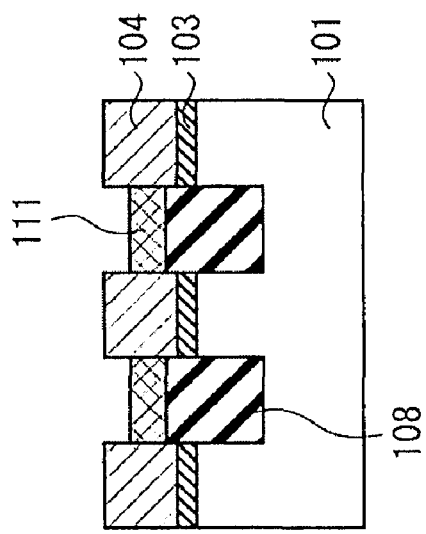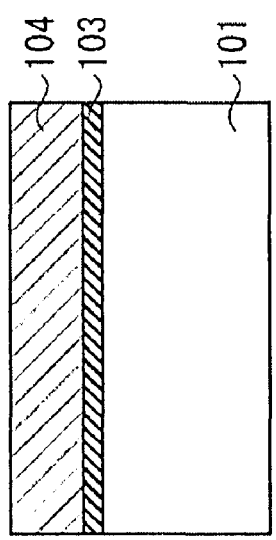

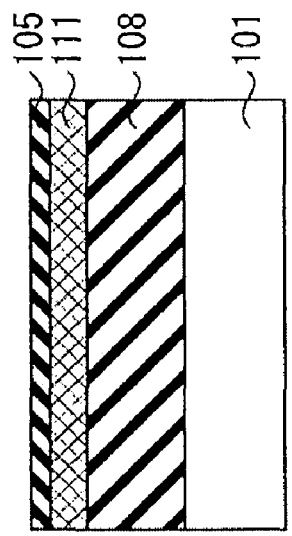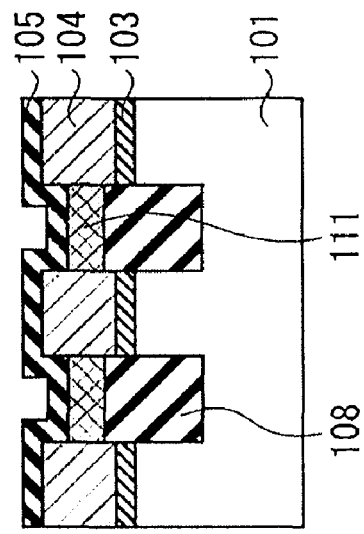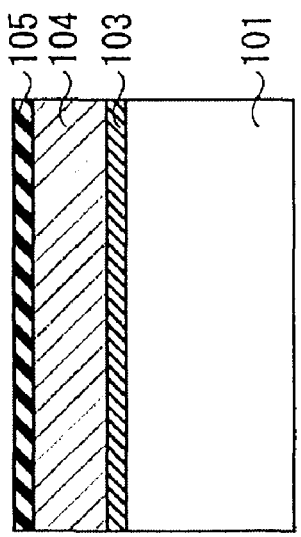

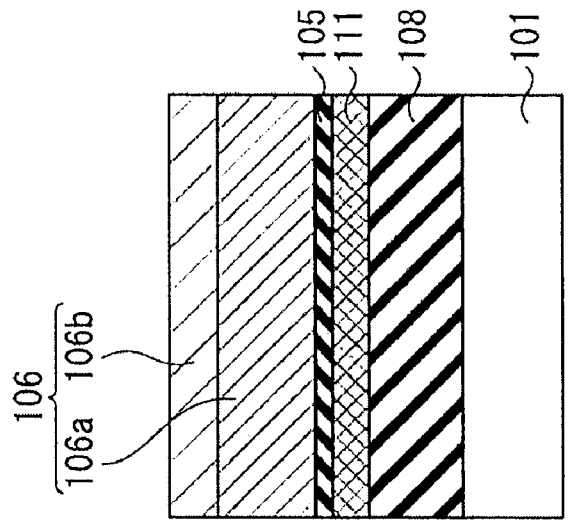
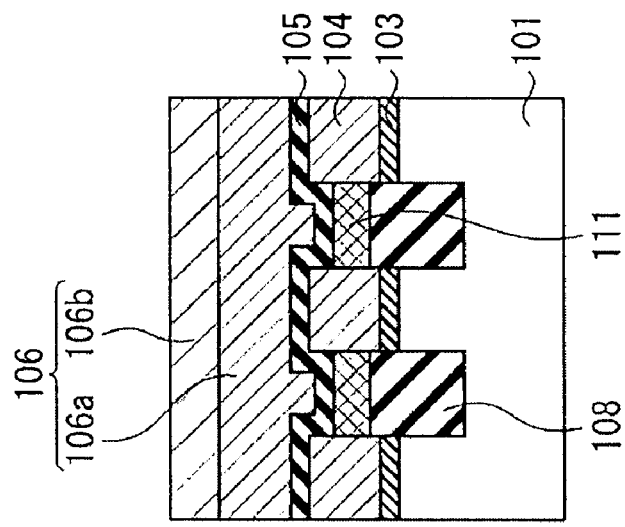
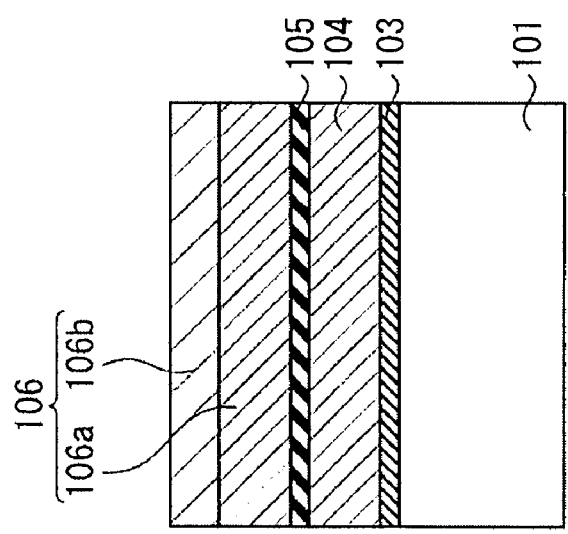
Fig.7C
Fig.7B
Fig.7A

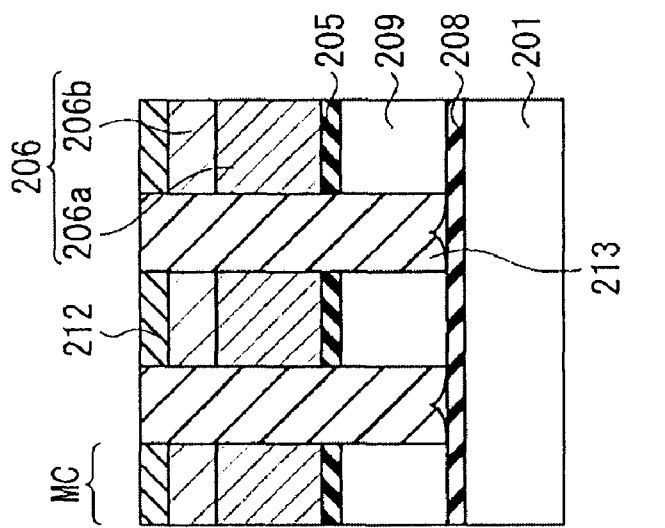
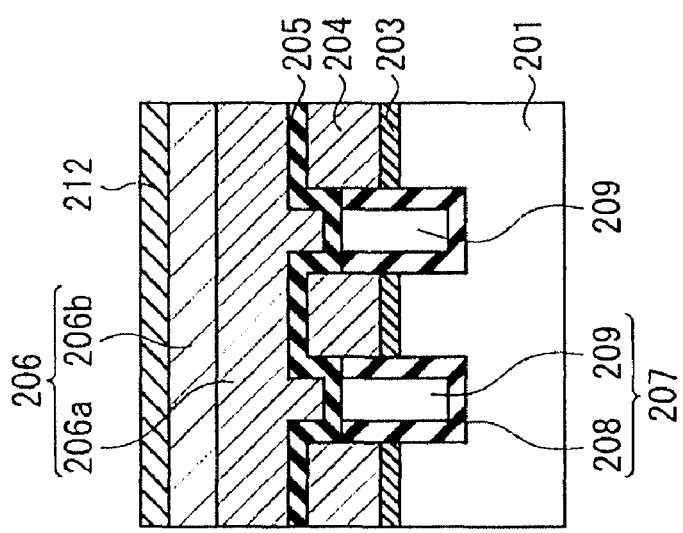
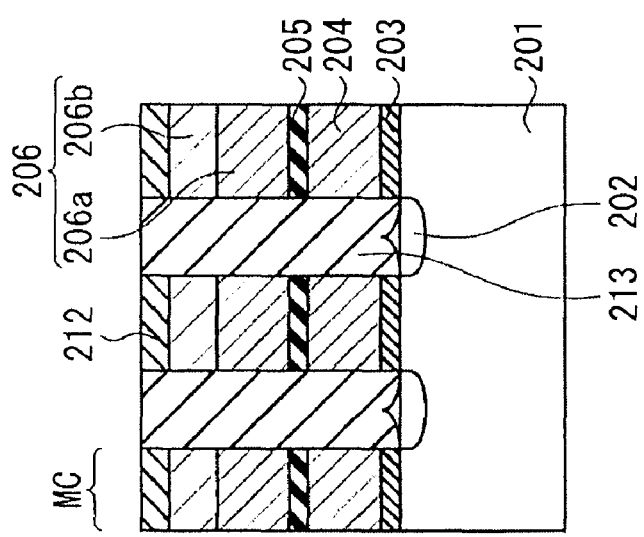

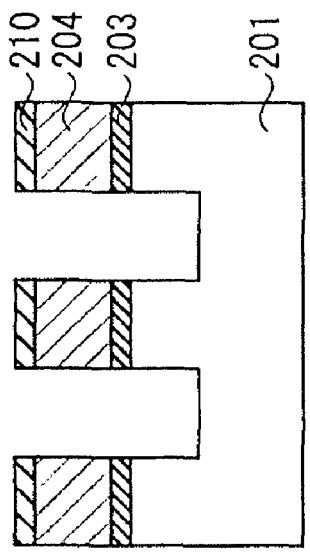
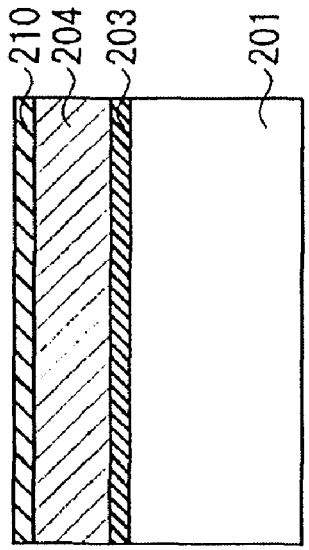
Fig.14C
Fig.14B
Fig.14A

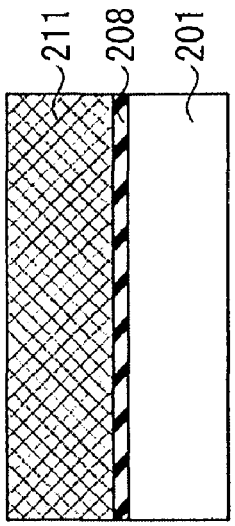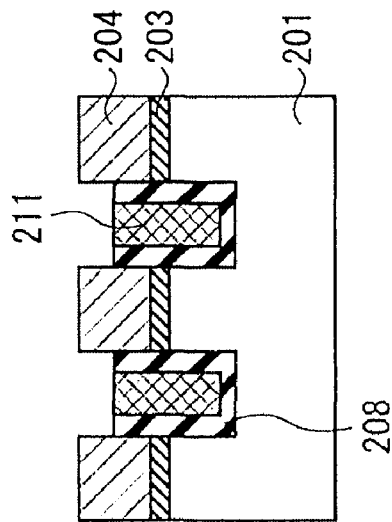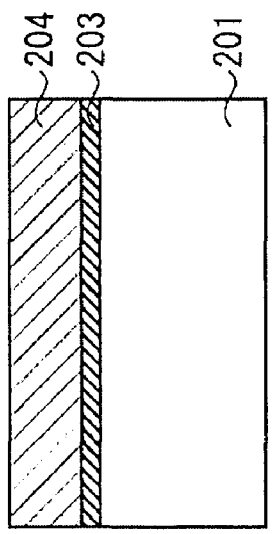

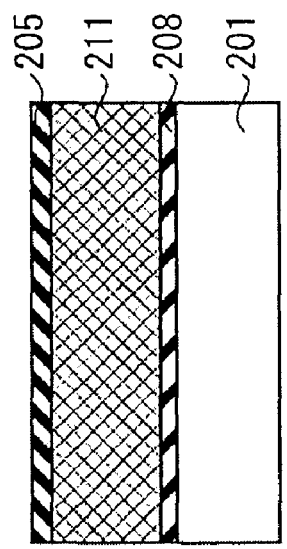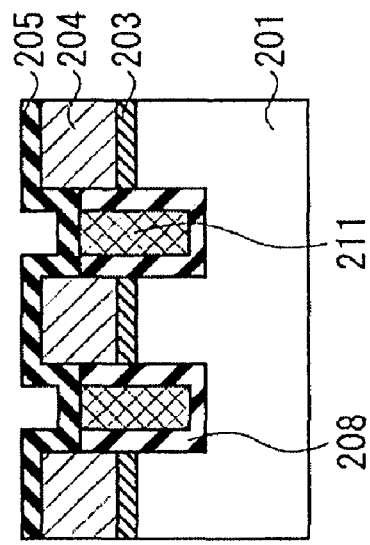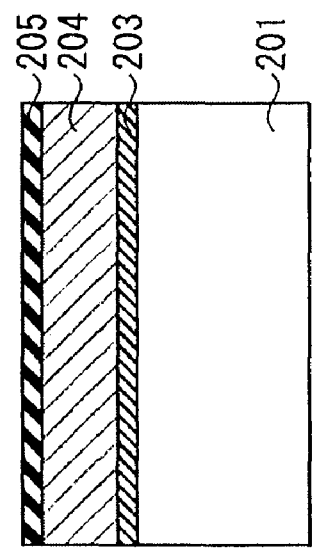
Fig.17C
Fig.17B
Fig.17A

SEMICONDUCTOR MEMORY DEVICE AND MANUFACTURING METHOD THEREOF

CROSS REFERENCE TO RELATED APPLICATIONS

This application is based on and claims the benefit of priority from prior Japanese Patent Application No. 2008-188916, filed on Jul. 22, 2008, the entire contents of which are incorporated herein by reference.

BACKGROUND OF THE INVENTION

1. Field of the Invention

The present invention relates to a semiconductor memory device and its fabrication process.

2. Description of the Related Art

In NAND type non-volatile semiconductor memory device, bit lines and word lines are arranged to extend to intersect with each other. Memory cells are formed in each region in which one of the bit lines and one of the word lines intersects each other. A memory cell comprises a tunnel insulator film, a floating gate, inter-poly insulator film, and a control gate laminated in this order. STIs(Shallow Trench Isolation), comprising element isolation trenches and element isolation films, are formed between adjacent memory cells next to word line direction.

Silicon dioxide is one of the materials used for the element isolation film. As the distance between memory cells decrease with the design rule reduction, a parasitic capacitance between neighboring floating gates increases. It causes a cell interference problem between neighboring cells and leads to a mal-functioning of the device.

To reduce the parasitic capacitance and fix this problem, air gaps in STIs are proposed by using a poor coverage silicon oxide film for filling of the element isolation trenches.

With this structure, inter poly insulator films and control gate electrodes do not cover side walls of floating gate electrodes. That causes another problem of reducing a coupling ratio between floating gate electrodes and control gate electrodes.

SUMMARY OF THE INVENTION

One aspect of this invention is to provide a semiconductor memory device comprises: a semiconductor substrate; a plurality of tunnel insulator films formed on the semiconductor substrate along a first direction and a second direction orthogonal to the first direction with certain spaces in each directions; a plurality of charge accumulation layers formed on the plurality of tunnel insulator films, respectively; a plurality of element isolation regions formed on the semiconductor substrate, the plurality of element isolation regions including a plurality of trenches formed along the first direction between the plurality of tunnel insulator films, a plurality of element isolation films filled in the plurality of trenches; a plurality of inter poly insulator films formed over the plurality of element isolation regions and on the upper surface and side surfaces of the plurality of charge accumulation layer along the second direction in a stripe shape; a plurality of air gaps formed between the plurality of element isolation films filled in the plurality of trenches and the plurality of inter poly insulator films; and a plurality of control gate electrodes formed on the plurality of inter poly insulator films.

Another aspect of this invention is to provide a method of manufacturing a semiconductor memory device comprises: forming a first insulator film on a semiconductor substrate; forming a first electrode layer used for a charge accumulation layer on the first insulator film; forming a plurality of trenches in the semiconductor substrate along a first direction with a certain space by etching the first electrode layer, the tunnel insulator film, and the semiconductor substrate; forming a second insulator film in the plurality of trenches, the upper surface of the second insulator film being at a higher position than the upper surface of the first insulator film and at a lower position than the upper surface of the first electrode layer; forming a sacrifice film on the second insulator film, the upper surface of the sacrifice film being at a lower position than the upper surface of the first electrode layer; forming a third insulator film on the upper surface and side surfaces of the first electrode, and the sacrifice film; forming a second electrode layer used for a control gate electrode on the third insulator film; forming a plurality of word lines along a second direction orthogonal to the first direction by etching the second electrode layer, the third insulator film and the first electrode layer, exposing the surface of the semiconductor substrate and the sacrifice film; removing the sacrifice film; and forming a fourth insulator film between the word lines.

BRIEF DESCRIPTION OF THE DRAWINGS

FIGS. 3A, 3B and 3C are cross-sectional diagrams showing the fabrication method of a semiconductor memory device according to the first embodiment of the invention.

FIGS. 5A, 5B and 5C are cross-sectional diagrams showing the fabrication method of a semiconductor memory device subsequent to FIGS. 4A, 4B and 4C.

FIGS. 6A, 6B and 6C are cross-sectional diagrams showing the fabrication method of a semiconductor memory device subsequent to FIGS. 5A, 5B and 5C.

FIGS. 7A, 7B and 7C are cross-sectional diagrams showing the fabrication method of a semiconductor memory device subsequent to FIGS. 6A, 6B and 6C.

FIGS. 13A, 13B and 13C are cross-sectional diagrams of a semiconductor memory device according to the third embodiment of the invention taken along the lines A-A, B-B, and C-C shown in FIG. 1, respectively.

FIGS. 14A, 14B and 14C are cross-sectional diagrams showing the fabrication method of a semiconductor memory device according to the third embodiment.

FIGS. 16A, 16B and 16C are cross-sectional diagrams showing the fabrication method of a semiconductor memory device subsequent to FIGS. 14A, 14B and 14C.

FIGS. 17A, 17B and 17C are cross-sectional diagrams showing the fabrication method of a semiconductor memory device subsequent to FIGS. 15A, 15B and 15C.

DETAILED DESCRIPTION OF THE EMBODIMENTS

Figure 1:
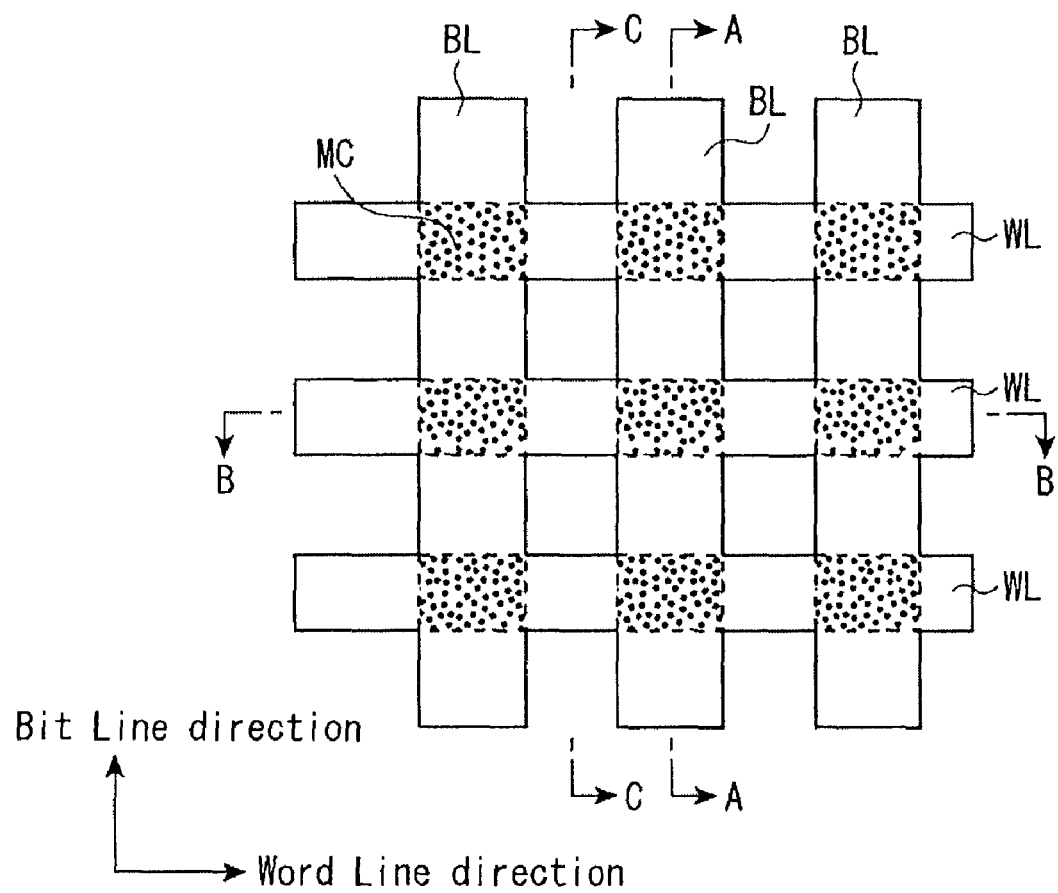
FIG. 1 is a plan diagram of a semiconductor memory device according to the first embodiment of the invention.

As a semiconductor memory device according to an embodiment of the invention, a NAND flash memory device is described with reference to the accompanying drawings. In the drawings to be referred to in the following description, the same or similar reference numerals designate the same or similar parts. The drawings are schematic, and the ratio between thickness and the planner dimension of each part, and the rate among the thickness of layers differ from actual ones, for example.

First Embodiment

FIG. 1 illustrates a plan diagram of a semiconductor memory device according to the first embodiment of the invention. A plurality of word lines WLs cross with a plurality of bit lines BLs orthogonally. A plurality of memory cell transistors MCs are formed at the locations where the WLs cross with BLs.

A plurality of memory cell transistors MCs are formed with a certain space along the word line direction and bit line direction, both directions run orthogonally each other. A plurality of element isolation regions are formed between memory cell transistors located side by side in the bit line direction.

Figure 2C:
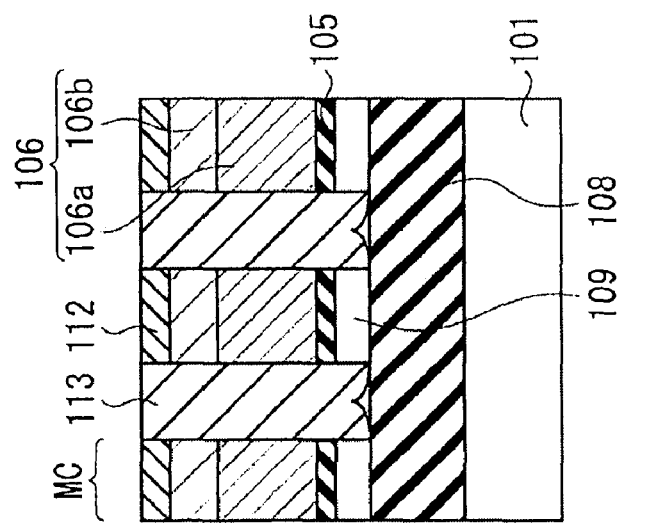
FIGS. 2A, 2B and 2C are cross-sectional diagrams of a semiconductor memory device according to the first embodiment of the invention taken along the lines A-A, B-B, and C-C shown in FIG. 1, respectively.
Figure 2B:
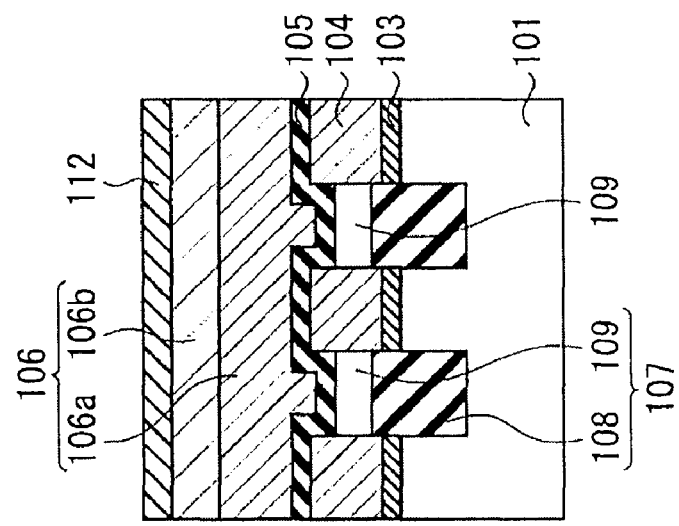
Figure 2A:
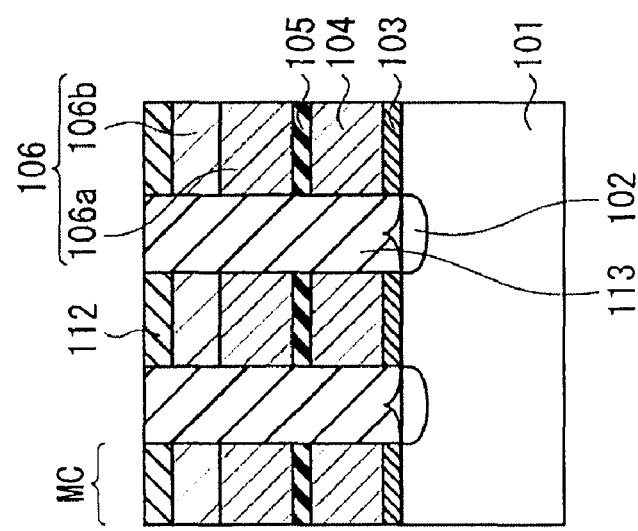

FIGS. 2A, 2B and 2C are cross-sectional diagrams taken along the lines A-A, B-B, and C-C shown in FIG. 1, respectively.

As illustrated in FIG. 2A, diffusion areas 102 are formed on a surface of a semiconductor substrate 101 with a certain space. A plurality of memory cell transistors MC are formed on the surface of the semiconductor substrate 101 with tunnel insulator films 103, floating gate electrodes 104, inter poly insulator films 105 and control gate electrodes 106 laminated in this order. A control gate electrode 106 has a poly silicon layer 106a and a silicide layer 106b. An inter layer dielectric 113 is formed in the spaces of memory cell transistors. Air gaps are formed between the semiconductor substrate 101 and the inter layer dielectric 113.

As illustrated in FIG. 2B, a plurality of element isolation regions 107 are formed on the semiconductor substrate 101 with a certain space. The element isolation region has an element isolation trench and an element isolation film 108 filled in the element isolation trench. Air gaps 109 are formed between the element isolation films 108 and the inter poly insulator films 105. The tunnel insulator films 103 and the floating gate electrodes 104 are formed on the semiconductor substrate 101 between element isolation regions 107. The upper surface of the floating gate electrodes 104 is located at a higher position than the upper surface of the element isolation films 108.

As illustrated in FIG. 2C, the air gaps 109, the inter poly insulator films 105 and the control gate electrodes 106 are formed on the element isolation films 108. The air gaps 109 are sandwiched by the inter layer dielectrics 113.

The inter poly insulator films 105 are formed on the upper surfaces and upper part of the side surfaces of the floating gate electrodes 104, and above the element isolation regions 107. The inter poly insulator films 105 have a topography corresponding to the under layer structure of the floating gate electrodes 104 and element isolation regions 107.

The control gate electrodes 106 are formed on the inter poly insulators 105. The bottom surface of the control gate electrodes 106 shows a topography corresponding to the under layer structure of the surface of the inter poly insulator films 105.

As this embodiment has the air gaps 109 between floating gate electrodes 104, the parasitic capacitances between floating gate electrodes 104 can be reduced and the interference between neighboring memory cells can be suppressed. At the same time, the control gate electrodes 106 and the floating gate electrodes 104 face each other in large area and the coupling ratio between them can be increased, because a part of side surface of the floating gate electrodes 104 faces the control gate electrodes 106.

The manufacturing method of the semiconductor device according to the first embodiment will now be described with reference to FIGS. 3 to 9. FIGS. 3A to 9A, FIGS. 3B to 9B, and FIGS. 3C to 9C represent cross sectional views along the line A-A (the bit line direction on the active areas), the line B-B (the word line direction), and the line C-C (the bit line direction on the STI areas) in FIG. 1, respectively. In the first step, a tunnel insulator film 103, for example silicon dioxide, is formed on the semiconductor substrate 101 with CVD (Chemical Vapor Deposition) method. On the tunnel insulator film 103, a floating gate electrode 104, consisting of, for example, a poly silicon film doped with Phosphorus, is formed.

In the next step, a silicon nitride film 110 is formed on the floating gate electrode 104, followed by a photo lithography method to form stripes of photo resist patterns (not shown) on the silicon nitride film 110 with a certain space along the bit line direction. Then, the silicon nitride film 110 is selectively etched with etching masks of photo resist patterns.

In the next step, the floating gate electrode 104, the tunnel insulator film 103, and the semiconductor substrate 101 are anisotropically etched by RIE (Reactive Ion Etching) method with etching masks of the silicon nitride films 110 to form a plurality of trenches T1 on the surface of the semiconductor substrate 101.

Figure 4A:
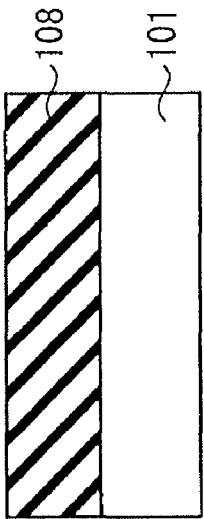
FIGS. 4A, 4B and 4C are cross-sectional diagrams showing the fabrication method of a semiconductor memory device subsequent to FIGS. 3A, 3B and 3C.
Figure 4B:
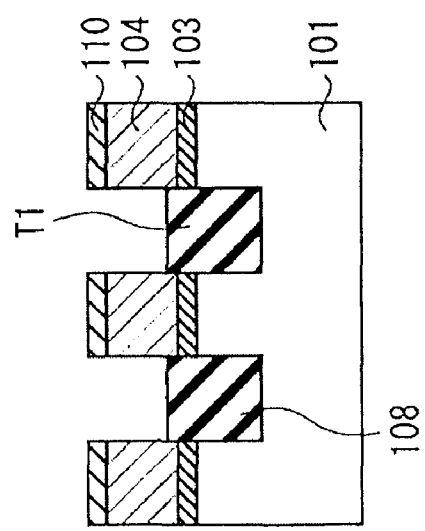
Figure 4C:
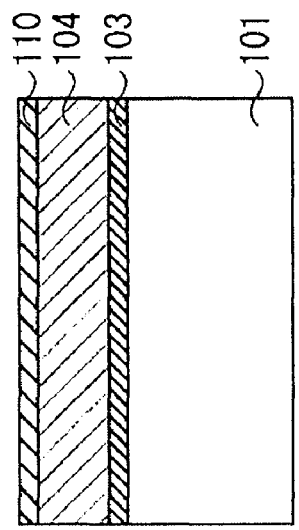

As shown in FIG. 4B, an insulator film, for example, a silicon dioxide film is filled in the plurality of trenches with, for example, high density plasma CVD method. Then the silicon dioxide film is etched to a certain height by RIE method to form element isolation films 108. In this embodiment, the upper surface of the element isolation films 108 is located at a higher position than the upper surface of the tunnel insulator films 103.

As shown in FIG. 5B, an insulator film 111, for example, a PSZ (Polysilazane) film is applied on the element isolation films 108 to fill the trenches T1. Then, the surface of the PSZ film 111 is planarized by a CMP (Chemical Mechanical Polishing) method with the silicon nitride film 110 as a stopper. Then, the PSZ film 111 is etched to a certain height by a RIE method.

The PSZ film 111 is removed in the following processes, and the region where the PSZ film 111 is filled becomes an air gap. So, the etching of the PSZ film is done considering with the region where the air gap has to be formed. In the first embodiment, the upper surface of the PSZ film 111 is located at a lower position than the upper surface of the floating gate electrodes 104 after the PSZ film etching. Then, the silicon nitride 110 is removed to expose the upper surface of the floating gate electrodes 104.

As shown in FIGS. 6A, 6B, and 6C, an inter poly insulator film 105 is formed on the upper surface and the upper part of the side surface of the floating gate electrodes 104, and the upper surface of the PSZ film 111. The inter poly insulator film 105 consists of, for example, ONO (Oxide Nitride Oxide), or NONON (Nitride Oxide Nitride Oxide Nitride), or NOAON (Nitride Oxide Al2O3 Oxide Nitride). The inter poly insulator film 105 has a topography corresponding to the under layer structure of the floating gate electrodes 104 and the PSZ films 111.

As shown in FIGS. 7A, 7B, and 7C, a poly silicon film 106a is formed on the inter poly insulator film 105 with the CVD method. Then, a part of the poly silicon film 106a is Silicided to form a silicide layer 106b. The Control gate electrode 106 consists of the poly silicon film 106a and the silicide layer 106b. This Silicidation process can be performed after the gate electrodes are patterned.

Figure 8C:
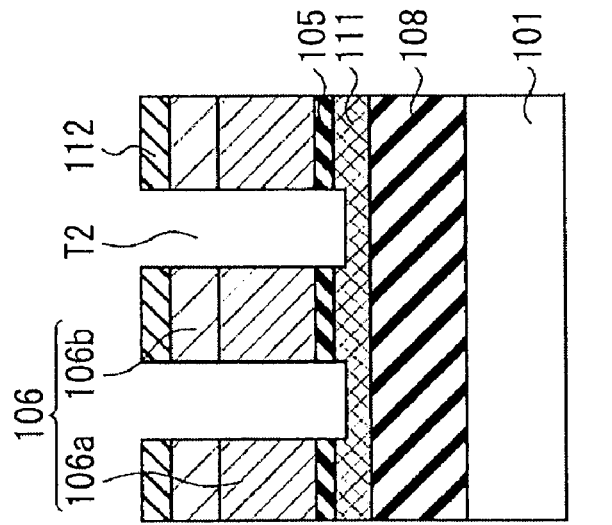
FIGS. 8A, 8B and 8C are cross-sectional diagrams showing the fabrication method of a semiconductor memory device subsequent to FIGS. 7A, 7B and 7C.
Figure 8B:
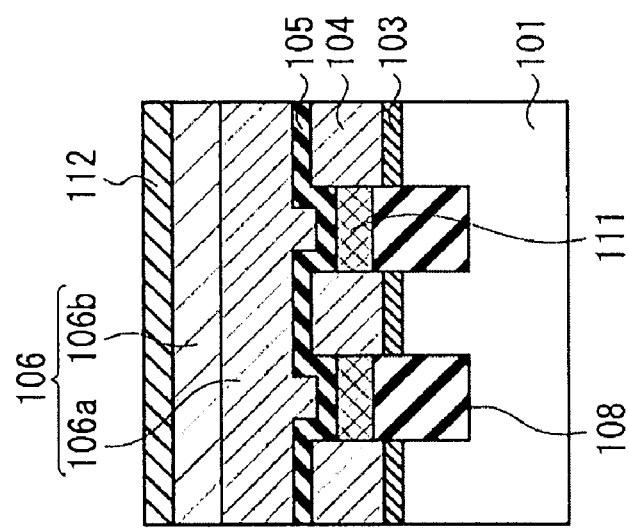
Figure 8A:
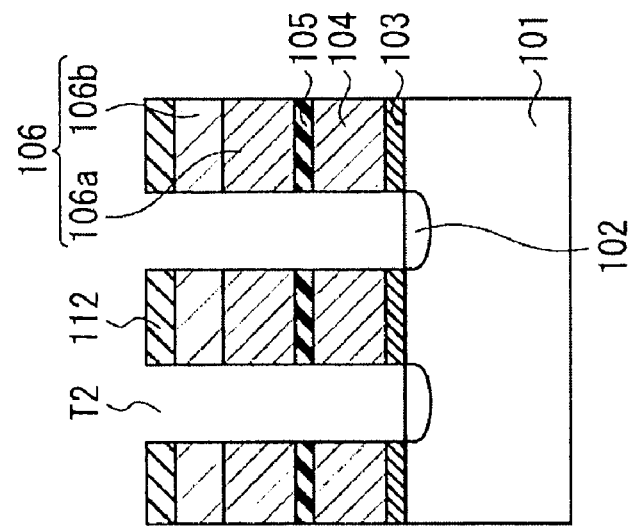
Figure 9C:
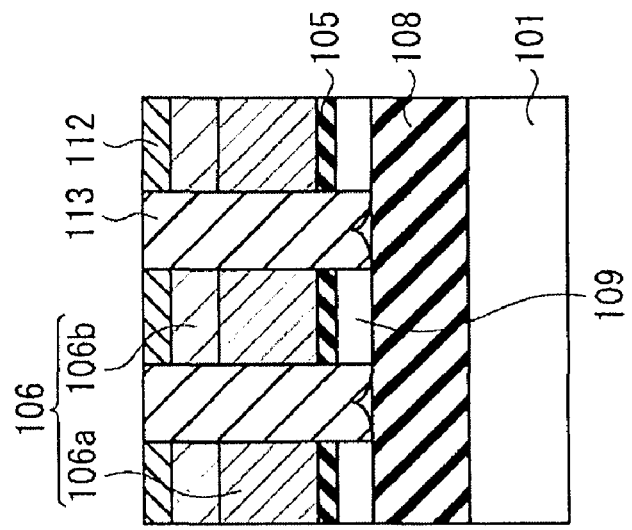
FIGS. 9A, 9B and 9C are cross-sectional diagrams showing the fabrication method of a semiconductor memory device subsequent to FIGS. 8A, 8B and 8C.
Figure 9B:
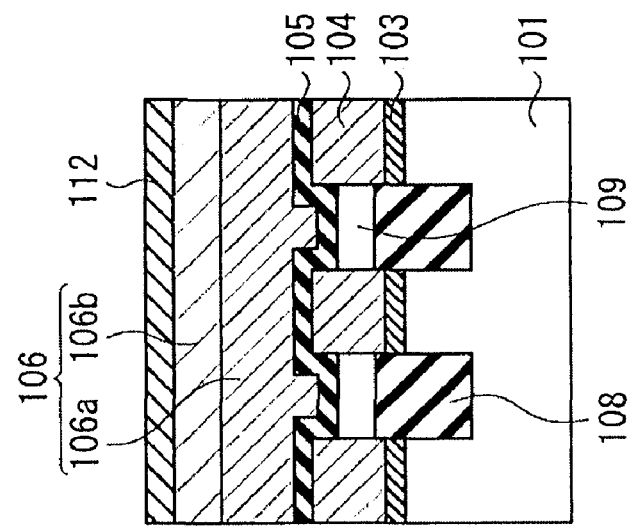
Figure 9A:
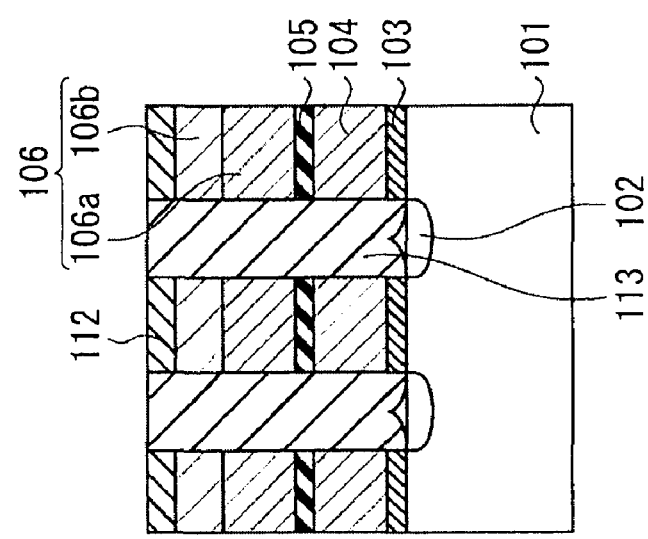

As shown in FIGS. 8A and 8C, after a silicon nitride film 112 is formed on the control gate electrodes 106, a photo lithography method is used to form stripes of photo resist patterns (not shown) on the silicon nitride film 112 with a certain space along the word line direction. Then, the silicon nitride film 112 is selectively etched with etching masks of photo resist patterns.

In the next step, the control gate electrode 106, the inter poly insulator 105, the floating gate electrodes 104, and the tunnel insulator films 103 are anisotropically etched by RIE method with etching masks of the silicon nitride films 112 to form a plurality of word lines. After this etching process, the surface of the semiconductor substrate 101 is exposed like in FIG. 8A, and a plurality of grooves T2 is formed to expose the surface of the PSZ film 111 like in FIG. 8C. To avoid an over etching into the semiconductor substrate 101, the tunnel insulator film 103 does not have to be removed during the formation of the plurality of grooves T2.

The PSZ film 111 is etched during the etching of the floating gate electrodes 104. The etched amount of the PSZ film 111 depends on the etching rate of the PSZ film 111 in the etching process of the floating gate electrodes 104. With lower etching rate, the PSZ film 111 is etched little amount. With higher etching rate, the PSZ film between word lines is totally etched and the element isolation film 108 is exposed.

In the next step, impurity ions are implanted into the semiconductor substrate 101 with the word lines as implant masks, followed by an activation anneal to form diffusion areas 102.

As shown in FIG. 9, the PSZ film is removed by wet etching with, for example, hydrofluoric acid (HF) or buffered hydrofluoric acid (BHF). In this wet etching process, the higher etching rate of PSZ film than that of the silicon dioxide film makes it possible to remove the PSZ film 111 while the element isolation film 108 and the inter poly insulator 105 remain. When a silicon nitride film is used for the bottom film of the inter poly insulator laminated films 105, for example, NONON film, the etching selectivity between the inter poly insulator films 105 and the PSZ film 111 becomes large.

In the next step, an inter layer dielectric 113 is formed with plasma CVD TEOS (Tetraethoxysilane) or LP (Low Pressure) CVD TEOS. As the plasma CVD TEOS and the LPCVD TEOS have a poor coverage, the inter layer dielectric 113 is not formed in the regions where the PSZ film 111 has been removed. Therefore, the regions become air gaps 109. The air gaps 109 can also be formed in the bit line direction, and they can reduce the interference between memory cells.

According to the first embodiment, the air gaps 109 are formed between the floating gate electrodes 104 over the element isolation regions 107, and the parasite capacitance between the floating gate electrodes 104 can be reduced. Also, as the upper surface of the PSZ film 1 is located at a lower position than the upper surface of the floating gate electrodes 104, the area where the control gate electrodes 106 face the floating gate electrodes 104 and the coupling ratio between the control gate electrodes 106 and the floating gate electrodes 104 becomes large.

Modified First Embodiment

Figure 10C:
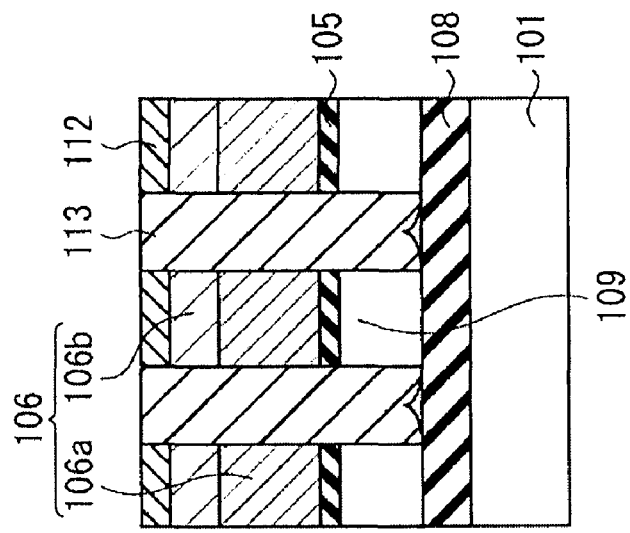
FIGS. 10A, 10B and 10C are cross-sectional diagrams of a semiconductor memory device according to the modified first embodiment of the invention taken along the lines A-A, B-B, and C-C shown in FIG. 1, respectively.
Figure 10B:
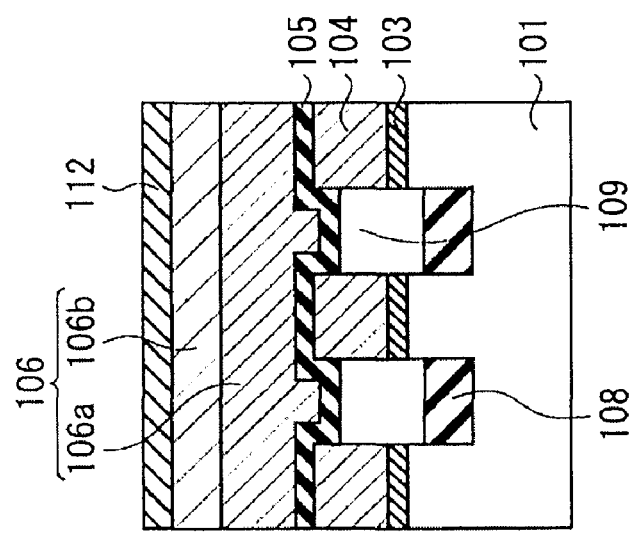
Figure 10A:
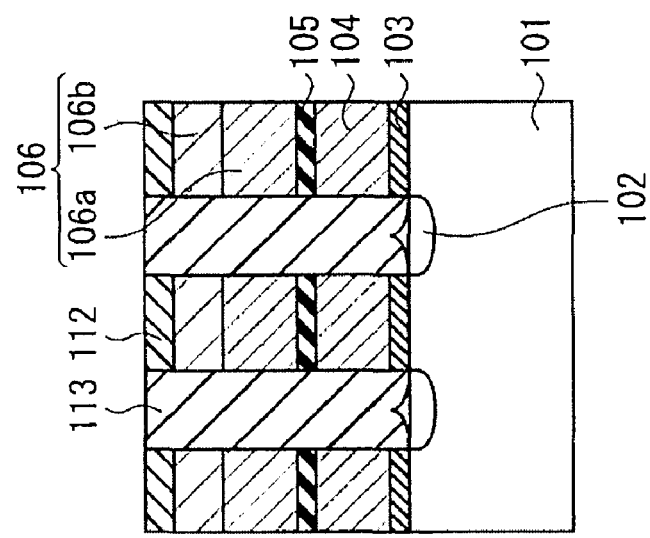

FIGS. 10A, 10B and 10C illustrate cross sectional diagrams of the modified first embodiment. In this embodiment, the upper surface of the element isolation film 108 is located at a lower position than the upper surface of the tunnel insulator film 103. As the volume of the air gaps 109 becomes large with this structure, the parasite capacitance between the floating gate electrodes 104 can be reduced further.

Second Embodiment

Figure 11A:
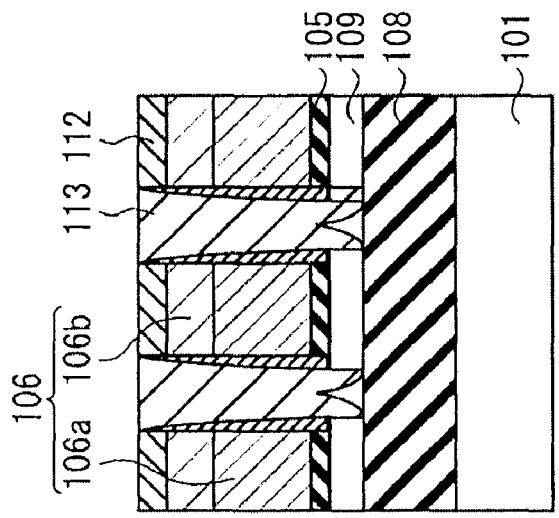
FIGS. 11A, 11B and 11C are cross-sectional diagrams of a semiconductor memory device according to the second embodiment of the invention.
Figure 11B:
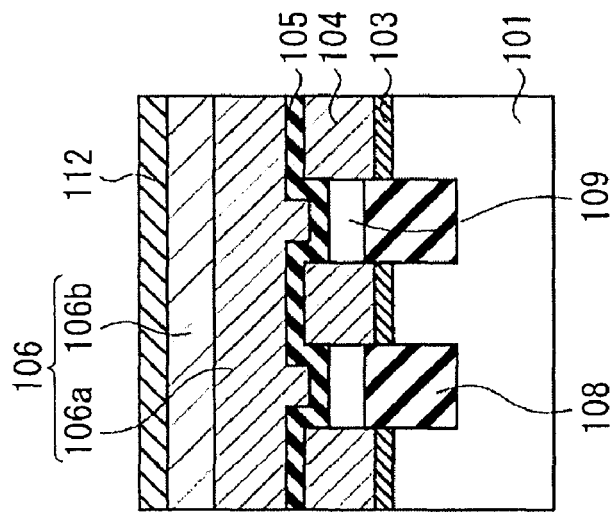
Figure 11C:
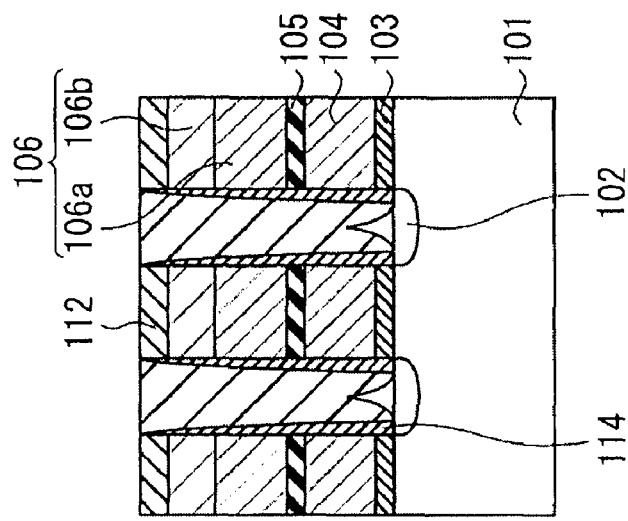

FIGS. 11A, 11B and 11C illustrate schematic diagrams of a semiconductor memory device according to the second embodiment of the invention. The plan view is the same as that of the first embodiment shown in FIG. 1. FIGS. 11A, 11B and 11C are cross-sectional diagrams taken along the lines A-A, B-B, and C-C shown in FIG. 1, respectively.

In this embodiment, a protection film 114 consisting of, for example, HTO (High Temperature Oxide) is formed on the side walls of the word lines. The protection film 114 covers the tunnel insulator film 103 and the inter poly insulator film 105 during the wet etching process removing the PSZ film 111. As the word line spaces is narrower with the protection film 114, the coverage of the inter layer dielectric 113 at the word line spaces become worse and the air gaps 109 become larger.

Figures 12A, 12B, 12C:
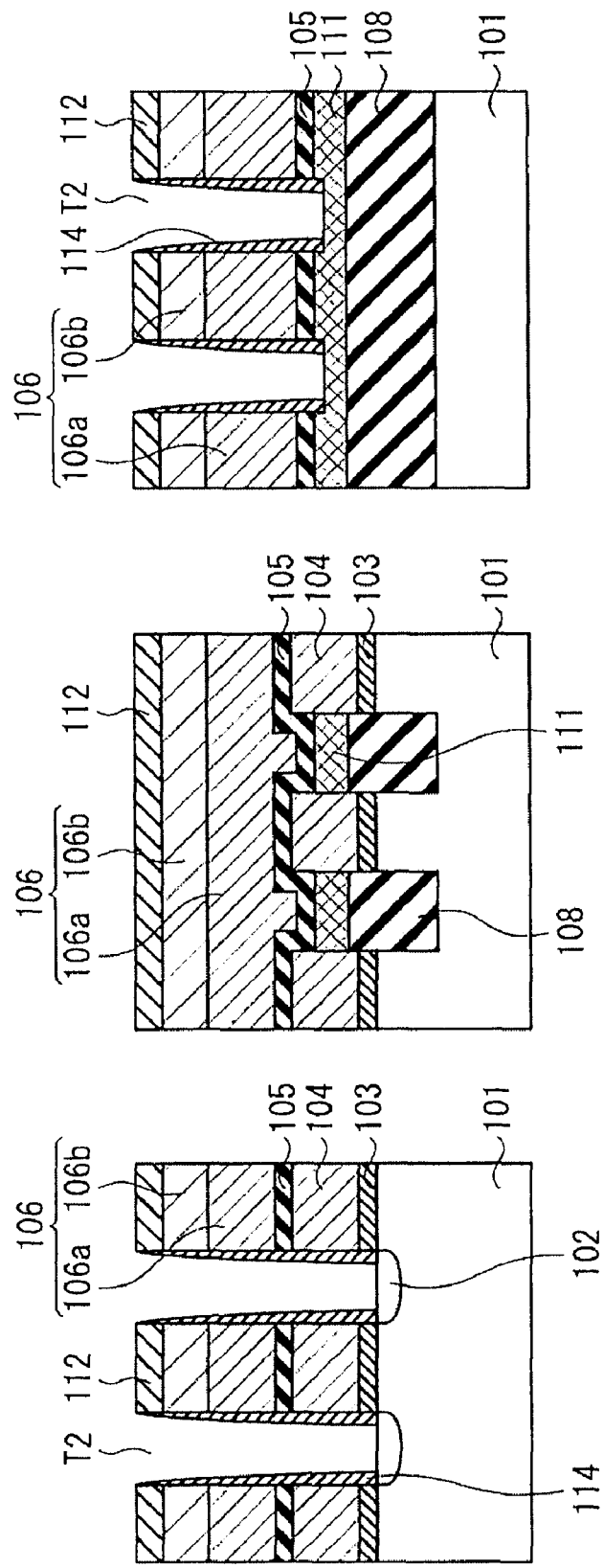
FIGS. 12A, 12B and 12C are cross-sectional diagrams showing one of the fabrication steps of a semiconductor memory device according to the second embodiment of the invention.

FIGS. 12A, 12B and 12C illustrate schematic diagrams of one of the manufacturing steps of the semiconductor device according to the second embodiment. After patterning of word lines, a protection film 114 is formed on the side walls of the word lines. The PSZ film 111, formed between the element isolation film 108 and the inter poly insulator film 105 as shown in FIG. 12B and 12C, can be removed by the wet solution penetrating from the word line spaces where the PSZ film is exposed.

Third Embodiment

FIGS. 13A, 13B and 13C illustrate schematic diagrams of a semiconductor memory device according to the third embodiment of the invention. The plan view is the same as that of the first embodiment shown in FIG. 1. FIGS. 13A, 13B and 13C are cross-sectional diagrams taken along the lines A-A, B-B, and C-C shown in FIG. 1, respectively.

As illustrated in FIG. 13A, diffusion areas 202 are formed on a surface of a semiconductor substrate 201 with a certain space. A plurality of memory cell transistors MC are formed on the surface of the semiconductor substrate 201 with tunnel insulator films 203, floating gate electrodes 204, inter poly insulator films 205 and control gate electrodes 206 laminated in this order. A control gate electrode 206 has a poly silicon layer 206a and a silicide layer 206b. An inter layer dielectric 213 is formed in the spaces of memory cell transistors. Air gaps are formed between the semiconductor substrate 201 and the inter layer dielectric 213.

As illustrated in FIG. 13B, a plurality of element isolation regions 207 are formed on the semiconductor substrate 201 with a certain space. The element isolation region has an element isolation trenches and a U-shaped element isolation film 208 formed on the bottom and side walls of the element isolation trench. Air gaps 209 are formed between the element isolation films 208 and the inter poly insulator films 205. The tunnel insulator films 203 and the floating gate electrodes 204 are formed on the semiconductor substrate 201 between element isolation regions 207. The upper surface of the floating gate electrodes 204 is located at a higher position than the upper surface of the element isolation films 208. In this embodiment, the upper surface of the element isolation region 207 means a surface formed by the top of the insulator film 208 on the side walls of element isolation trenches and the upper border of the air gap 209.

The inter poly insulator films 205 are formed on the upper surfaces and upper part of the side surfaces of the floating gate electrodes 204, and on the upper surface of the element isolation regions 207. The inter poly insulator films 205 have a topography corresponding to the under layer structure of the floating gate electrodes 204 and element isolation regions 207.

The control gate electrodes 206 are formed on the inter poly insulators 205. The bottom surface of the control gate electrodes 206 shows a topography corresponding to the under layer structure of the surface of the inter poly insulator films 205.

As illustrated in FIG. 13C, the air gaps 209, the inter poly insulator films 205 and the control gate electrodes 206 are formed on the element isolation films 208. The air gaps 209 are sandwiched by the inter layer dielectrics 213. The thickness of the element isolation film 208 is thinner than that of the element isolation film 108 in the first embodiment. Therefore, the height of the air gap 209 can be larger than that of the air gap 109 in the first embodiment.

As this embodiment has the air gaps 209 between floating gate electrodes 204, the parasitic capacitances between floating gate electrodes 204 can be reduced and the interference between neighboring memory cells can be suppressed. At the same time, the control gate electrodes 206 and the floating gate electrodes 204 face each other in large area and the coupling ratio between them can be increased, because a part of side surface of the floating gate electrodes 204 faces the control gate electrodes 206.

Also, as the height of the air gaps 209 becomes large, the parasite capacitance between the floating gate electrodes 204 can be reduced, too.

The manufacturing method of the semiconductor device according to the second embodiment will now be described with reference to FIGS. 14 to 20. FIGS. 14A to 20A, FIGS. 14B to 20B, and FIGS. 14C to 20C represent cross sectional views along the line A-A (the bit line direction on the active areas), the line B-B (the word line direction), and the line C-C (the bit line direction on the STI areas) in FIG. 1, respectively.

In the first step, a tunnel insulator film 203, for example silicon dioxide, is formed on the semiconductor substrate 201 with CVD method. On the tunnel insulator film 203, a floating gate electrode 204, consisting of, for example, a poly silicon film doped with Phosphorus, is formed.

In the next step, a silicon nitride film 210 is formed on the floating gate electrode 204, followed by a photo lithography method to form stripes of photo resist patterns (not shown) on the silicon nitride film 210 with a certain space along the bit line direction. Then, the silicon nitride film 210 is selectively etched with etching masks of photo resist patterns.

In the next step, the floating gate electrode 204, the tunnel insulator film 203, and the semiconductor substrate 201 are anisotropically etched by RIE method with etching masks of the silicon nitride film 210 to form a plurality of trenches T1 on the surface of the semiconductor substrate 201.

Figure 15A:
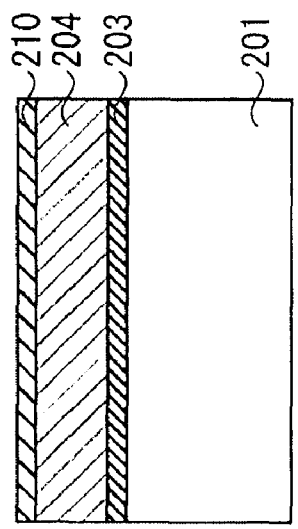
FIGS. 15A, 15B and 15C are cross-sectional diagrams showing the fabrication method of a semiconductor memory device subsequent to FIGS. 13A, 13B and 13C.
Figure 15B:
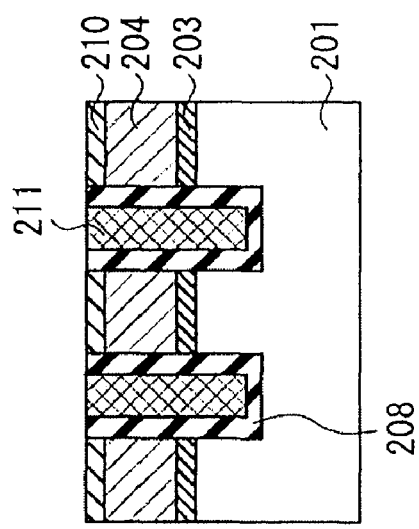
Figure 15C:
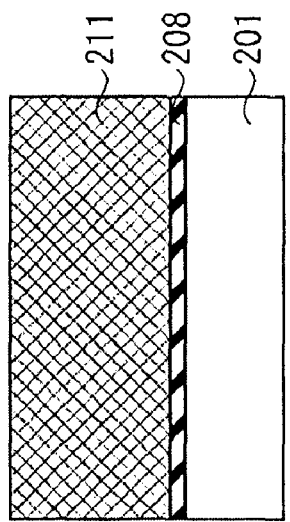

As shown in FIG. 15B, an element isolation film 208, for example, a TEOS film is formed with, for example, LPCVD or ALD (Atomic Layer Deposition) method. The element isolation film 208 is formed on the bottom and the side walls of the trenches T1 with a certain thickness not to fill the trenches T1 completely. The element isolation film 208 can be formed with the thermal oxidation method. Then, a PSZ film 211 is applied to fill the trenches T1.

Next, the surface of element isolation film 208 and the PSZ film 211 is planarized by a CMP method with the silicon nitride film 210 as a stopper.

As shown in FIGS. 16A, 16B and 16C, the element isolation film 208 and the PSZ film 211 are etched to a certain height by a RIE method. In this embodiment, the upper surface of the element isolation film 208 and the PSZ film 211 is located at a lower position than the upper surface of the floating gate electrodes 204 and at a higher position than the bottom surface of the floating gate electrodes 204 after the etching. Then, the silicon nitride 210 is removed to expose the upper surface of the floating gate electrodes 204.

As shown in FIGS. 17A, 17B, and 17C, an inter poly insulator film 205 is formed on the upper surface and the upper part of the side surfaces of the floating gate electrodes 204, and the upper surface of the element isolation film 208 and the PSZ film 211. The inter poly insulator film 205 consists of, for example, ONO, or NONON, or NOAON. The inter poly insulator film 205 has a topography corresponding to the under layer structure of the floating gate electrodes 204, the element isolation film 208 and the PSZ films 211.

Figure 18C:
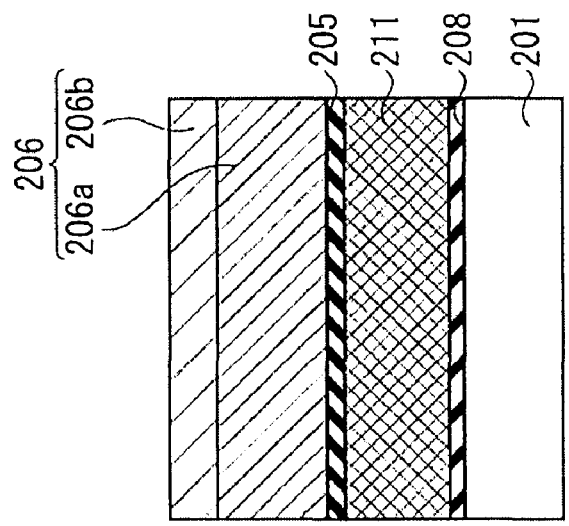
FIGS. 18A, 18B and 18C are cross-sectional diagrams showing the fabrication method of a semiconductor memory device subsequent to FIGS. 16A, 16B and 16C.
Figure 18B:
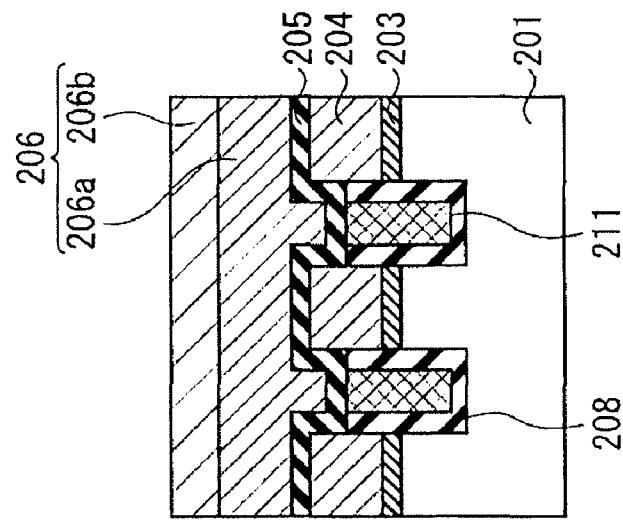
Figure 18A:
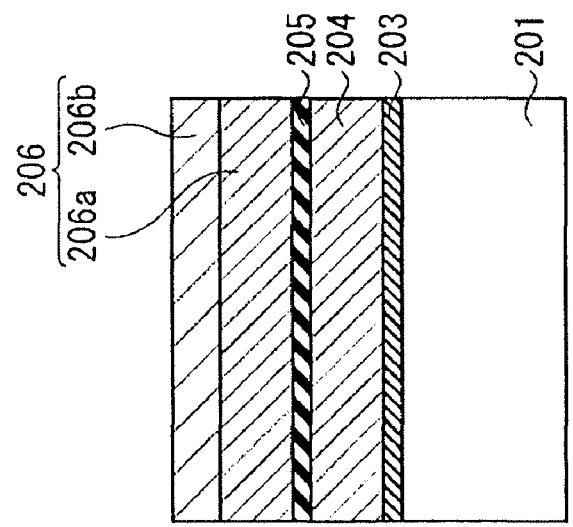

As shown in FIGS. 18A, 18B, and 18C, a poly silicon film 206a is formed on the inter poly insulator film 205 with the CVD method. Then, a part of the poly silicon film 206a is silicided to form a silicide layer 206b. The Control gate electrodes 206 consists of the poly silicon film 206a and the silicide layer 206b. This silicidation process can be performed after the gate electrodes are patterned.

Figure 19C:
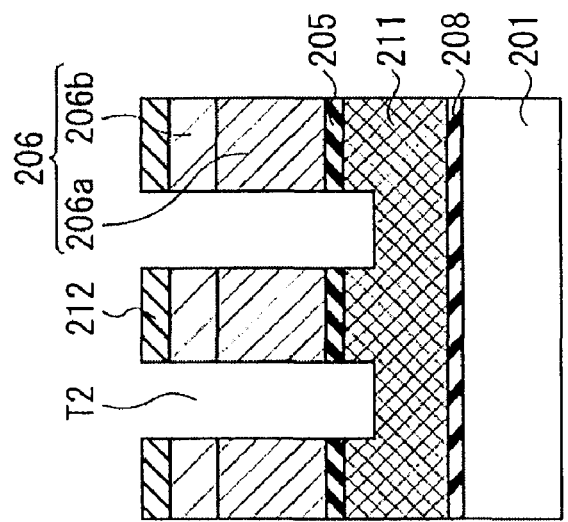
FIGS. 19A, 19B and 19C are cross-sectional diagrams showing the fabrication method of a semiconductor memory device subsequent to FIGS. 17A, 17B and 17C.
Figure 19B:
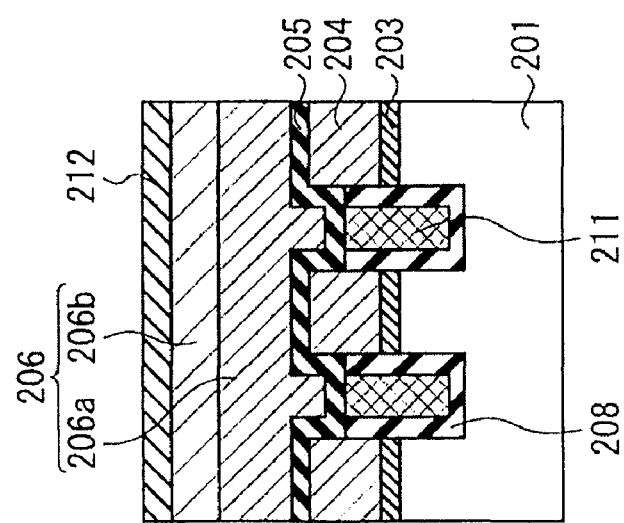
Figure 19A:
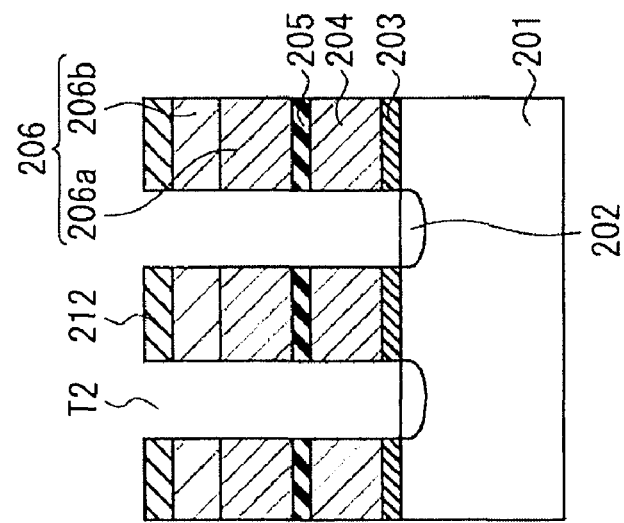
Figure 20C:
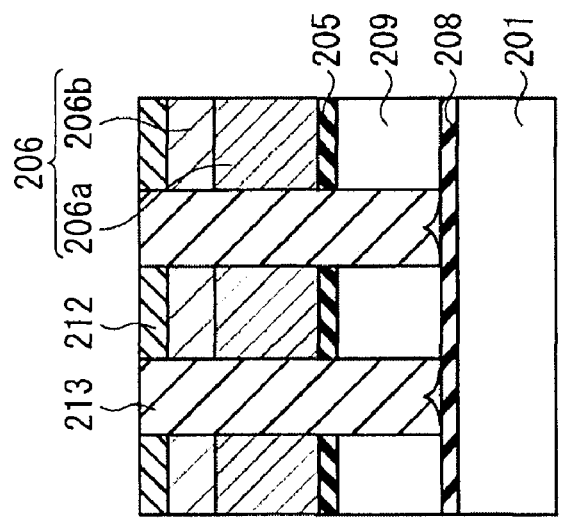
FIGS. 20A, 20B and 20C are cross-sectional diagrams showing the fabrication method of a semiconductor memory device subsequent to FIGS. 18A, 18B and 18C.
Figure 20B:
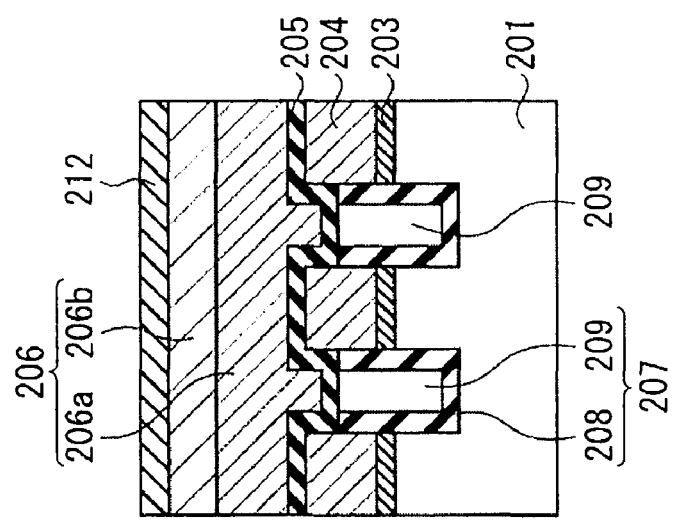
Figure 20A:
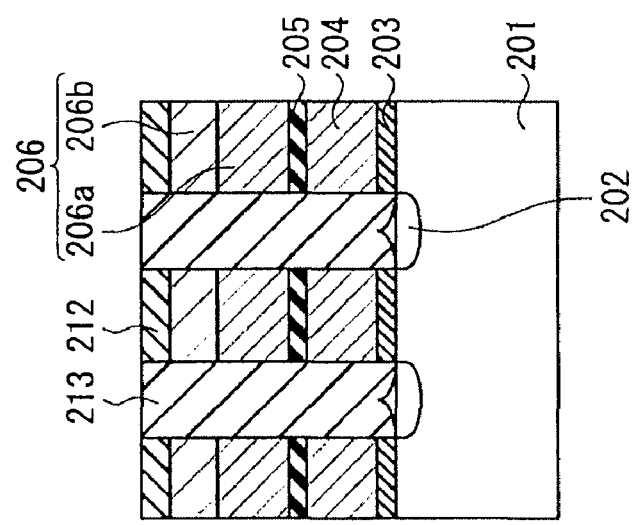

As shown in FIGS. 19A and 19C, after silicon nitride film 212 is formed on the control gate electrodes 206, a photo lithography method is processed to form stripes of photo resist patterns (not shown) on the silicon nitride film 212 with a certain space along the word line direction. Then, the silicon nitride film 212 is selectively etched with etching masks of photo resist patterns.

In the next step, the control gate electrode 206, the inter poly insulator 205, the floating gate electrodes 204, and the tunnel insulator film 203 are anisotropically etched by RIE method with etching masks of the silicon nitride films 212 to form a plurality of word lines. With this etching process, the surface of the semiconductor substrate 201 is exposed like in FIG. 19A, and a plurality of grooves T2 is formed to expose the surface of the PSZ film 211.

The PSZ film 211 is etched during the etching process of the floating gate electrodes 204. The etched amount of the PSZ film 211 depends on the etching rate of the PSZ film 211 in the etching process of the floating gate electrodes 204. With lower etching rate, the PSZ film 211 is etched little amount. With higher etching rate, the PSZ film between the word lines is totally etched and the element isolation film 208 is exposed.

In the next step, impurity ions are implanted into the semiconductor substrate 201 with the word lines as implant masks, followed by an activation anneal to form diffusion areas 202.

As shown in FIG. 20, the PSZ film 211 is removed by wet etching with, for example, hydrofluoric acid (HF) or buffered hydrofluoric acid (BHF). In this wet etching process, the higher etching rate of the PSZ film than that of the silicon dioxide film makes it possible to remove the PSZ film 211 while the element isolation film 208 and the inter poly insulator 205 remain. As the U-shaped element isolation films 208 cover the side surface of the tunnel insulator films 203, the element isolation films 208 prevent the tunnelinsulators 203 from being etched during this wet etching process. When a silicon nitride film is used for the bottom film of the inter poly insulator laminated films 105, for example, NONON film, the etching selectivity between the inter poly insulator films 205 and the PSZ film 211 becomes large.

In the next step, an inter layer dielectric 213 is formed with plasma CVD TEOS or LPCVD TEOS. As the plasma CVD TEOS and LPCVD TEOS have a poor coverage, the inter layer dielectric 213 is not formed in the regions where the PSZ film 211 has been removed. Therefore, the regions become air gaps 209. The air gaps 209 can also be formed in the bit line direction, and they can reduce the interference between memory cells.

According to the third embodiment, the air gaps 209 are formed between the floating gate electrodes 204 over the element isolation regions 207, and the parasitic capacitance between the floating gate electrodes 204 can be reduced. Also, as the upper surface of the element isolation region 207 is located at a lower position than the upper surface of the floating gate electrode 204, the area where the control gate electrodes 206 face the floating gate electrodes 204, and the coupling ratio between the control gate electrodes 206 and the floating gate electrodes 204 becomes large.

Fourth Embodiment

Figure 21C:
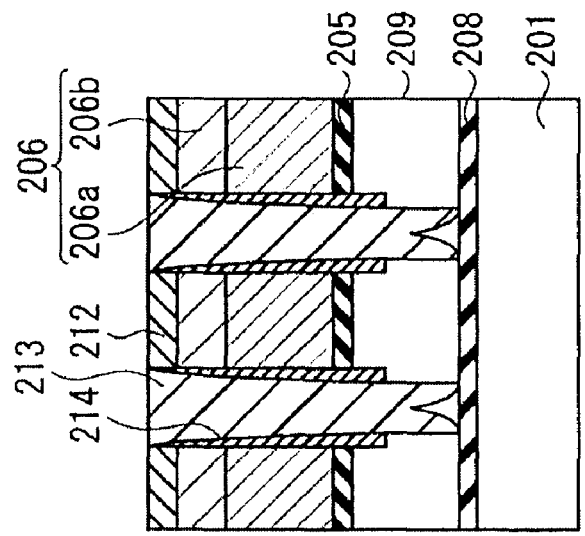
FIGS. 21A, 21B and 21C are cross-sectional diagrams of a semiconductor memory device according to the fourth embodiment of the invention.
Figure 21B:
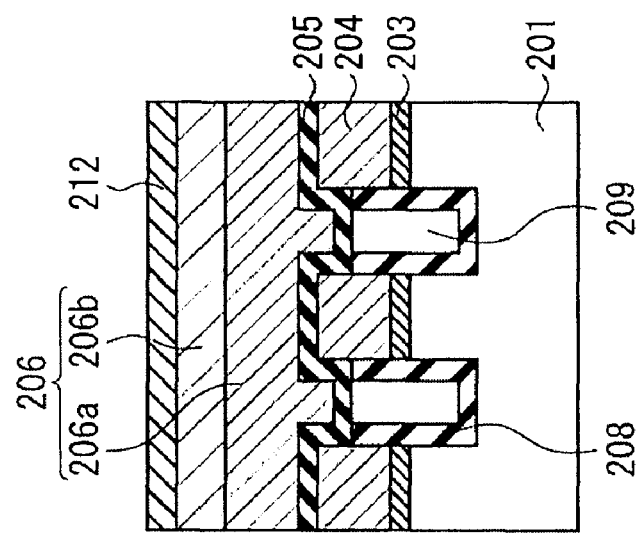
Figure 21A:
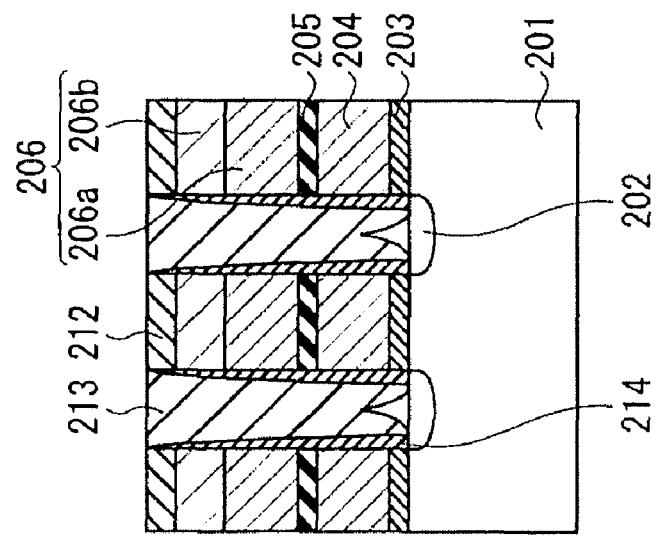

FIGS. 21A, 21B and 21C illustrate schematic diagrams of a semiconductor memory device according to the fourth embodiment of the invention. The plan view is the same as that of the first embodiment shown in FIG. 1. FIGS. 21A, 21B and 21C are cross-sectional diagrams taken along the lines A-A, B-B, and C-C shown in FIG. 1, respectively.

In this embodiment, a protection film 214 consisting of, for example, HTO is formed on the side walls of the word lines. The protection film 214 covers the tunnel insulator film 203 and the inter poly insulator film 205 during the wet etching process removing the PSZ film 211. As the word line spaces is narrower with the protection film 214, the coverage of the inter layer dielectric 213 at the word line spaces become worse and the air gaps 209 become larger.

Figure 22C:
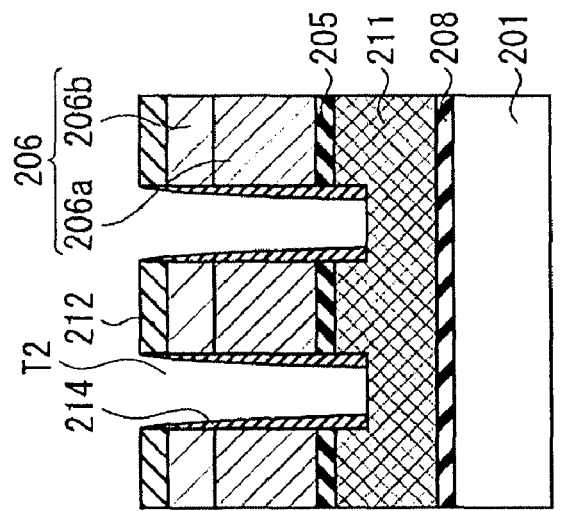
FIGS. 22A, 22B and 22C are cross-sectional diagrams showing one of the fabrication steps of a semiconductor memory device according to the fourth embodiment of the invention.
Figure 22B:
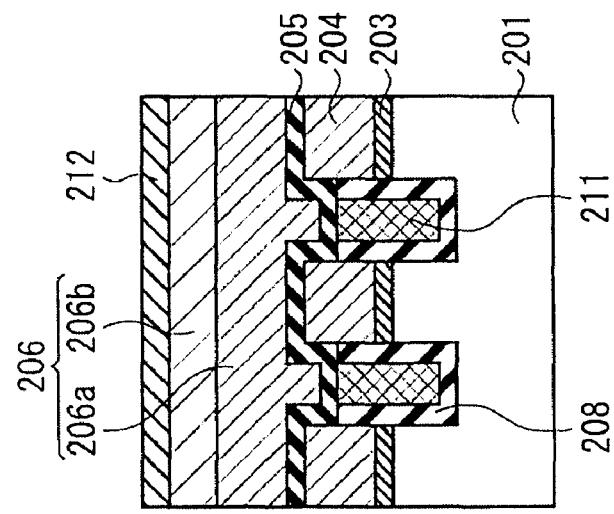
Figure 22A:
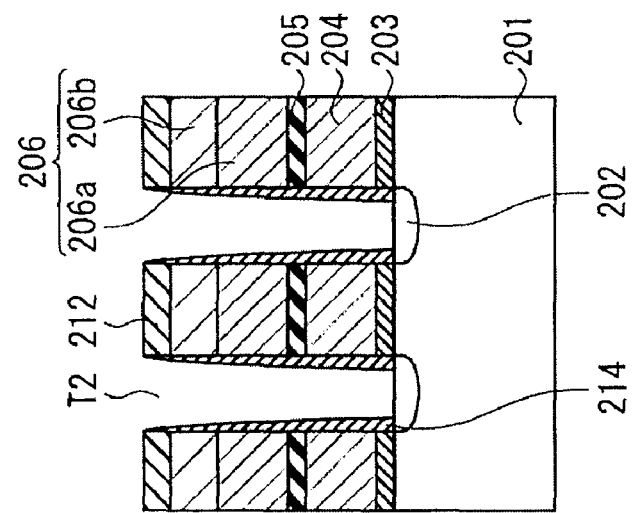

FIGS. 22A, 22B and 22C illustrate the schematic diagrams of one of the manufacturing steps of the semiconductor device according to the fourth embodiment. After patterning of word lines, a protection film 214 is formed on the side walls of the word lines. The PSZ film 211, formed between the element isolation film 208 and the inter poly insulator film 205 as shown in FIG. 22B and 22C, can be removed by the wet solution penetrating from the word line spaces where the PSZ film is exposed.

Fifth Embodiment

Figure 23A:
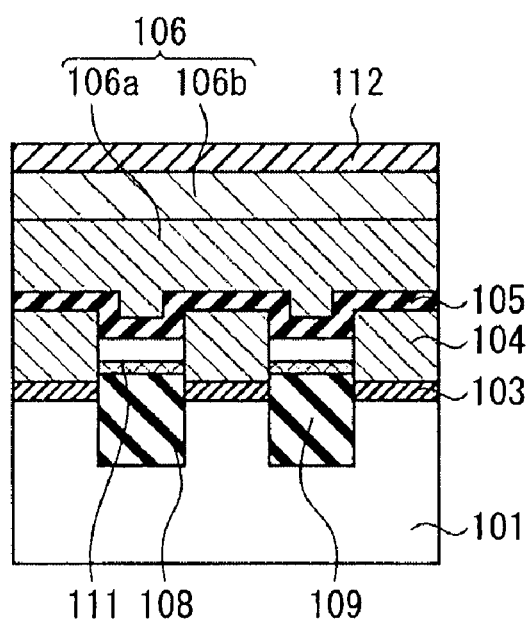
FIGS. 23A and 23B are cross-sectional diagrams of a semiconductor memory device according to the fifth embodiment of the invention.
Figure 23B:
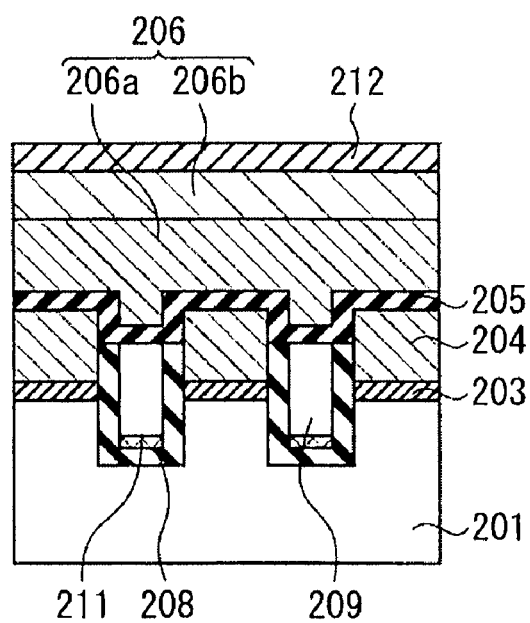

FIGS. 23A and 23B illustrate schematic diagrams of a semiconductor device according to the fifth embodiment. The plan view is the same as that of the first embodiment shown in FIG. 1. FIG. 23A is a cross-sectional diagram of the fifth embodiment applied to the first embodiment taken the line B-B in FIG. 1. FIG. 23B is a cross-sectional diagram of the fifth embodiment applied to the third embodiment taken the line B-B in FIG. 1.

In this embodiment, a part of the PSZ film 111 or 211 remains at the bottom of the air gaps 109 or 209. It can be realized when the etching time is reduced in order to avoid a wet etching damage to the inter poly insulator film 105 or 205.

The parasite capacitance between the floating gate electrodes can be reduced even when a part of the PSZ film 111 or 211 remains without being etched, because the air gaps 109 or 209 are still formed.

A resin material or a photo resist can be used for a sacrificial layer to form air gaps instead of the PSZ film used in the embodiments above.

Though floating gate type memory cells are used in the embodiments described above, the present invention can be applied to a semiconductor memory device with MONOS type memory cells as well.

The embodiments described above are examples and the present invention is not limited to the embodiments presented and described above. Various modifications may be made without departing from the spirit or scope of the general inventive concept as defined by the appended claims and their equivalents.

What is claimed is:

1. A semiconductor memory device comprising:
   a semiconductor substrate;
   a plurality of tunnel insulator films formed on the semiconductor substrate along a first direction and a second direction orthogonal to the first direction with certain spaces in each directions;
   a plurality of charge accumulation layers formed on the plurality of tunnel insulator films, respectively;
   a plurality of element isolation regions formed on the semiconductor substrate, the plurality of element isolation regions including a plurality of trenches formed along the first direction between the plurality of tunnel insulator films, and a plurality of element isolation films filled in the plurality of trenches;
   a plurality of inter poly insulator films formed over the plurality of element isolation regions and on the upper surface and side surfaces of the plurality of charge accumulation layers along the second direction in a stripe shape;

a plurality of air gaps formed between the plurality of element isolation films filled in the plurality of trenches and the plurality of inter poly insulator films;

a plurality of control gate electrodes formed on the plurality of inter poly insulator films;

an inter layer dielectric formed between the plurality of control gate electrodes and the plurality of charge accumulation layers; and air gaps formed between the inter layer dielectric and the semiconductor substrate.

2. The semiconductor memory device according to claim 1, further comprising:

an insulator film used for a protection film on the side surfaces of the tunnel insulator films, the charge accumulation layers, the inter poly insulator films and the control gate electrodes.

3. The semiconductor memory device according to claim 1, wherein the upper surface of the isolation film filled in one of the trenches in the element isolation regions is located at a higher position than the upper surface of the tunnel insulator film.

4. The semiconductor memory device according to claim 1, further comprising:

a polysilazane film located between the surface of the element isolation film in one of the trenches in the element isolation regions and the inter poly insulator film.

5. A semiconductor memory device comprising:

a semiconductor substrate;

a plurality of tunnel insulator films formed on the semiconductor substrate along a first direction and a second direction orthogonal to the first direction with certain spaces in each directions;

a plurality of charge accumulation layers formed on the plurality of tunnel insulator films, respectively;

a plurality of element isolation regions formed on the semiconductor substrate, the plurality of element isolation regions including a plurality of trenches formed along the first direction between the plurality of tunnel insulator films, and a plurality of U-shaped insulator films formed on the bottom and the side walls of the plurality of trenches;

a plurality of inter poly insulator films formed over the plurality of element isolation regions and on the upper surface and side surfaces of the plurality of charge accumulation layers along the second direction in a stripe shape;

a plurality of air gaps formed between the plurality of U-shaped insulator films filled in the plurality of trenches and the plurality of inter poly insulator films; and a plurality of control gate electrodes formed on the plurality of inter poly insulator films, wherein the upper border of the plurality of air gaps is located at a lower position than the upper surface of the plurality of the charge accumulation layers and at a higher position than the upper surface of the plurality of the tunnel insulator films;

an inter layer dielectric formed between the plurality of control gate electrodes and the plurality of charge accumulation layers; and air gaps formed between the inter layer dielectric and the semiconductor substrate.

6. The semiconductor memory device according to claim 5, further comprising:

a insulator film used for a protection film on the side surfaces of the tunnel insulator films, the charge accumulation layers, the inter poly insulator films and the control gate electrodes.

7. The semiconductor memory device according to claim 5, wherein the upper surface of the insulator film filled in one of the trenches in the element isolation regions is located at a higher position than the upper surface of the tunnel insulator film.

8. The semiconductor memory device according to claim 7, further comprising:

a polysilazane film located between the surface of the insulator film in one of the trenches in the element isolation regions and the inter poly insulator film.

9. The semiconductor memory device according to claim 5, further comprising:

a polysilazane film between the surface of the insulator film filled in one of the trenches in the element isolation regions and the inter poly insulator film.

10. A semiconductor memory device comprising:

a semiconductor substrate;

a plurality of tunnel insulator films formed on the semiconductor substrate along a first direction and a second direction orthogonal to the first direction with certain spaces in each directions;

a plurality of charge accumulation layers formed on the plurality of tunnel insulator films, respectively;

a plurality of element isolation regions formed on the semiconductor substrate along the first direction, the plurality of element isolation regions including a plurality of element insulation films and a plurality of air gaps formed on the plurality of element isolation films;

a plurality of inter poly insulator films formed on the plurality of air gaps and on the upper surface and side surfaces of the plurality of charge accumulation layers along the second direction in a stripe shape;

a plurality of control gate electrodes formed on the plurality of inter poly insulator films;

an inter layer dielectric formed between the plurality of control gate electrodes and the plurality of charge accumulation layers; and air gaps formed between the inter layer dielectric and the semiconductor substrate.

11. The semiconductor memory device according to claim 10, wherein the upper border of the plurality of air gaps is located at a lower position than the upper surface of the charge accumulation layer and at a higher position than the upper surface of the tunnel insulator film.

12. The semiconductor memory device according to claim 11, further comprising:

a polysilazane film located between the upper surface of the element insulator film and the inter poly insulator film.

13. A semiconductor memory device comprising:

a semiconductor substrate;

a plurality of tunnel insulator films formed on the semiconductor substrate along a first direction and a second direction orthogonal to the first direction with certain spaces in each directions;

a plurality of charge accumulation layers formed on the plurality of tunnel insulator films, respectively;

a plurality of element isolation regions formed on the semiconductor substrate along the first direction, the plurality of element isolation regions including a plurality of element isolation trenches, a plurality of U-shaped element insulation films formed on the bottom and side surfaces of the plurality of element isolation trenches, and a plurality of air gaps formed inside of the plurality of U-shaped element isolation films;

a plurality of inter poly insulator films formed on the plurality of air gaps and on the upper surface and side surfaces of the plurality of charge accumulation layers along the second direction in a stripe shape;

a plurality of control gate electrodes formed on the plurality of inter poly insulator films;

an inter layer dielectric formed between the plurality of control gate electrodes and the plurality of charge accumulation layers; and air gaps formed between the inter layer dielectric and the semiconductor substrate.

14. The semiconductor memory device according to claim 13, wherein the upper border of the plurality of air gaps is located a lower position than the upper surface of the charge accumulation layer and at a higher position than the upper surface of the tunnel insulator film.

* * * * *